(12) United States Patent
Posseme et al.

(10) Patent No.: US 11,387,147 B2
(45) Date of Patent: Jul. 12, 2022

(54) METHOD FOR PRODUCING A COMPONENT BY FILLING A CAVITY WITHIN AN ELECTRICAL ISOLATION AREA WITH CARBON-BASED MATERIAL

(71) Applicant: COMMISSARIAT A L'ENERGIE ATOMIQUE ET AUX ENERGIES ALTERNATIVES, Paris (FR)

(72) Inventors: Nicolas Posseme, Grenoble (FR); Cyrille Le Royer, Grenoble (FR); Fabrice Nemouchi, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/988,892

(22) Filed: Aug. 10, 2020

(65) Prior Publication Data

US 2021/0066133 A1 Mar. 4, 2021

(30) Foreign Application Priority Data

Aug. 23, 2019 (FR) ...................................... 19 09376

(51) Int. Cl.
*H01L 21/8234* (2006.01)
*H01L 21/762* (2006.01)
(Continued)

(52) U.S. Cl.
CPC ............... *H01L 21/823481* (2013.01); *H01L 21/28123* (2013.01); *H01L 21/76224* (2013.01);
(Continued)

(58) Field of Classification Search
CPC ..... H01L 21/823481; H01L 21/823878; H01L 21/76224; H01L 21/76837; H01L 29/0649;
(Continued)

(56) References Cited

U.S. PATENT DOCUMENTS 8,026,571 B2 * 9/2011 Lu .................... H01L 21/823807
257/506
8,216,904 B2 * 7/2012 Dove .................. H01L 29/6659
438/296

(Continued)

OTHER PUBLICATIONS

French Preliminary Search Report dated Apr. 17, 2020 in French Application 19 09376 filed on Aug. 23, 2019 (with English Translation of Categories of Cited Documents & Written Opinion), 11 pages.

*Primary Examiner* — Younes Boulghassoul
(74) *Attorney, Agent, or Firm* — Oblon, McClelland, Maier & Neustadt, L.L.P.

(57) ABSTRACT

A method is provided for producing a component based on a plurality of transistors on a substrate including an active area and an electrical isolation area, each transistor including a gate and spacers on either side of the gate, the electrical isolation area including at least one cavity formed as a hollow between a spacer of a first transistor of the plurality of transistors and a spacer of a second transistor of the plurality of transistors, the first and the second transistors being adjacent, the method including: forming the gates of the transistors; forming the spacers; and forming a mechanically constraining layer for the transistors; and after forming the spacers and before forming the mechanically constraining layer, forming a filling configured to at least partially fill, with a filling material, the at least one cavity within the electrical isolation area, between the spacers of the first and the second transistors.

6 Claims, 4 Drawing Sheets

(51) Int. Cl.
  *H01L 29/78*  (2006.01)
  *H01L 29/66*  (2006.01)
  *H01L 21/28*  (2006.01)

(52) U.S. Cl.
  CPC .. *H01L 21/823468* (2013.01); *H01L 29/6656* (2013.01); *H01L 29/7843* (2013.01)

(58) Field of Classification Search
  CPC ......... H01L 29/0653; H01L 21/823468; H01L 21/823864; H01L 21/76834; H01L 29/7843; H01L 29/7846; H01L 29/6656; H01L 29/6653
  See application file for complete search history.

(56) References Cited

U.S. PATENT DOCUMENTS

| | | | |
|---|---|---|---|
| 2009/0032900 A1* | 2/2009 | Wang | H01L 21/76224 257/510 |
| 2009/0039442 A1* | 2/2009 | Han | H01L 29/41775 257/384 |
| 2009/0321840 A1* | 12/2009 | Pidin | H01L 21/823807 257/369 |
| 2010/0084712 A1 | 4/2010 | Kohli | |
| 2012/0025318 A1 | 2/2012 | Richter et al. | |
| 2012/0104500 A1 | 5/2012 | Cai et al. | |

\* cited by examiner

METHOD FOR PRODUCING A COMPONENT BY FILLING A CAVITY WITHIN AN ELECTRICAL ISOLATION AREA WITH CARBON-BASED MATERIAL

TECHNICAL FIELD

The present invention relates to the field of manufacturing microelectronic components. It will find an advantageous but non-limiting application in the manufacture of components based on transistors, these components allowing, for example, to form CMOS (for Complementary Metal Oxide Semiconductor) circuits or volatile memories such as Flash memories or non-volatile memories such as SRAM (Static Random Access Memory) memories.

PRIOR ART

In the field considered above, technologies are known for manufacturing transistors based on substrates of various technologies. They may be SOI (acronym for Silicon On Insulator) type substrates comprising an underlying semiconductor layer (often silicon), surmounted with an oxide layer called BOX, then a surface semiconductor layer, such as monocrystalline silicon. A refinement of SOI substrates is FDSOI (Fully Depleted Silicon On Insulator) technology, which corresponds to a support of the surface layer type of a fully depleted silicon-on-insulator plate.

A simple type of substrates is called "bulk" substrate. These substrates generally comprise a base made of a semiconductor material, typically silicon, and electrically isolating areas, typically made of silicon dioxide. The electrically isolating areas are exposed at one face of the substrate and delimit exposed areas made of the semiconductor material. Thus, the electrically isolating areas have an electrical separation function between different areas of semiconductor material, also called active areas. These active areas are the place of manufacture of transistors. It is in particular known to manufacture the electrical isolation areas by making lateral isolation trenches known as STI, acronym for "shallow trench isolation".

In this context, FIG. 1 shows a top view of a diagram of a substrate 1 provided, on a first face 10, with exposed areas comprising active areas 11 and electrical isolation areas 12. Transistor gates 21 can be formed on the basis of bars directed transversely, and more particularly perpendicularly, to the longitudinal orientation of the active areas 11.

It is also known that the production of CMOS components may require the addition of layers allowing to provide stress (in compression or respectively in tension) allowing to increase the performances of the devices, in particular field-effect transistors (of the P or respectively N type). These constraining layers are also called "stress liner" or CESL (Contact Etch Stop Liner). Their effectiveness depends on the thickness of the layer, often made from silicon nitride. But their deposition causes filling defects which result in the short-circuiting of neighbouring microelectronic components.

FIGS. 2 to 7B explain these defects. They show sectional views at line A-A of FIG. 1, so as to show the impact of the manufacturing steps on the electrical isolation areas. They show a summary of the successive phases of manufacturing components.

In FIG. 2, gates 21 (generally made of polysilicon with an underlying electrically isolating layer, typically an oxide, not shown in the figures) have been manufactured on the basis of the substrate 1. Moreover, at this stage, spacers 22 have been formed by depositing a layer of spacers, for example silicon nitride, and etching, with the well-known techniques of photolithography and etching. A hard mask 23 overlies the gate 21 of the transistors during this step which also includes the manufacture of source/drain areas on portions of the active area where the transistor is present, these portions being adjacent to the gate of the transistor. This manufacture involves successive N-type and P-type doping to form the two types of transistors in CMOS technologies. During these steps, the electrical isolation area 12 is affected such that a consumed area 13 appears on its surface, in the shape of hollow reliefs. This consumed area 13 is referred to hereinafter as a cavity.

Similarly, the step of removing the hard mask 23 presented in FIG. 3 increases the consumption of the material of the electrical isolation area 12 at the cavity 13. The material forming the electrical isolation area 12 is called dielectric material in the following.

A next step can be the deposition of a protective coating of the gates, in the form of a layer 14, for example a silicon nitride layer, as illustrated in FIG. 4.

As shown in FIG. 5, this protection must then be selectively removed on the horizontal parts to release the top of the gate and the horizontal surface of the isolation areas 12. For this purpose, openings 41 are formed in the protection layer 14. This step induces an additional consumption of the dielectric material forming the isolation areas 12.

The following steps are shown in FIG. 6 with silicidation of a portion 25 of the top of the gate 21 and simultaneously of the sources and drains of the active areas (not shown in the section).

Note that these steps generally include one or more heat treatments as well as (wet and/or plasma) cleaning phases which are also damaging to the integrity of the dielectric material.

Finally, a mechanically constraining layer 15 can be deposited. Given the undesirable consumption of the dielectric material between two adjacent transistors, the shape ratio of the cavities 13 is increased, which penalises the reliability of the filling of the spaces between two gates of adjacent transistors. FIG. 7A reveals that voids 72 may remain within the mechanically constraining layer 15 itself. Unfortunately, these residual voids cannot be filled by other layers above the mechanically constraining layer 15, such as a top electrical isolation layer generally made of silicon dioxide. This filling defect is all the more critical as the transistor stage thus formed is embedded in the middle of line of a complete micro-electronic device.

The residual voids thus formed typically extend along the transverse bars 211 of the gates, from one active area 11 to the other (see FIG. 1). This can have adverse consequences when one of these voids is opened during subsequent formation of electrical contacts, in particular when a problem with the alignment of these contacts occurs. In this case, when depositing the conductive material (for example tungsten), in particular by chemical vapour deposition, the void thus opened is closed by the conductive material and creates a short circuit between two contact areas of two adjacent active areas that are not intended to be electrically connected. FIG. 7B schematically reveals two contact elements 8 present on adjacent active areas 11 and connected by a short-circuit area 81 formed in an undesirable manner through a residual void linked to a defect in filling the mechanically constraining layer 15.

In view of these disadvantages, it is currently necessary to preserve a large space between two adjacent transistors, which implies either a limitation of the implantation density of the transistors on the substrate, or an additional step of etching the protective layer 14 to increase the width of the spaces between the transistors. Such an additional step can further affect the other constituents of the transistor, in particular the silicided portion, the semiconductor material of the active areas or even the dielectric material itself.

There is consequently a need to improve current microelectronic component manufacturing techniques.

A particular, an object of the present invention is a method for producing a component based on transistors which eliminates or limits the appearance of residual voids in the electrical isolation areas.

SUMMARY

One aspect of the invention relates to a method for producing a component based on a plurality of transistors on a substrate comprising at least one active area and one electrical isolation area, each transistor of the plurality of transistors comprising a gate and spacers on either side of the gate, the at least one electrical isolation area comprising at least one cavity formed as a hollow between a spacer of a first transistor of the plurality of transistors and a spacer of a second transistor of the plurality of transistors, said first and second transistors being adjacent. This method comprises:

forming the gates of the transistors,
forming the spacers, and
forming a mechanically constraining layer for the transistors.

Advantageously, the method further comprises, after forming the spacers and before forming the mechanically constraining layer:

a filling configured to at least partially fill with a filling material the at least one cavity within the at least one electrical isolation area, between the spacer of the first transistor and the spacer of the second transistor.

The present invention thus provides a solution allowing to stop a deepening of the cavities present in the electrical isolation areas (isolation trenches) after forming the spacers of the transistors. This solution optionally allows to eliminate these cavities by filling them with the filling material. Although it is advantageous that the cavities are completely removed, by a complete filling of their volume, it is possible to operate only a partial filling which, at the very least, limits the disadvantages of the cavities. Optionally, this partial filling can line the wall of the cavity to form a layer which is more resistant to the treatment steps to be followed (including etchings) than the layer wherein the cavities are present.

During the subsequent steps (removal of the implantation masks, removal of the hard mask, anisotropic etching, cleaning phases in particular) and before covering all the gates with the mechanically constraining layer (stress liner), the cavities are protected by the filling material.

The gradual consumption of the material of the isolation trenches during these various subsequent steps is thus prevented. The size of the cavities remains limited. This allows to prevent the formation of residual voids after depositing the stress liner.

According to one possibility, the filling material is removed before depositing the stress liner.

According to an alternative possibility, the filling material is preserved before depositing the stress liner. The isolation trenches damaged before or during the formation of the spacers are thus repaired.

According to one possibility, the filling step is repeated several times, depending on the consumption of the filling material before depositing the stress liner.

The method of the invention is therefore particularly useful in the context of covering isolation trenches with the stress liner.

The filling by the stress liner of the spaces between the gates is improved. Residual voids are avoided.

The invention also relates to components obtained by the described aspects of the method of the invention.

For example, another aspect of the present invention relates to a component based on a plurality of transistors formed on a substrate comprising at least one active area and at least one adjacent electrical isolation area, each transistor of the plurality of transistors comprising a gate and spacers on either side of the gate, the at least one electrical isolation area comprising at least one cavity formed as a hollow between a first spacer of a first transistor of the plurality of transistors and a second spacer of a second transistor of the plurality of transistors, said first and second transistors being adjacent. The component further comprises a mechanically constraining layer for the transistors.

Advantageously, at least one cavity of this component is filled with a filling material forming a plug and preferably configured to avoid a residual vacuum within the mechanically constraining layer.

BRIEF DESCRIPTION OF THE FIGURES

Purposes, objects, as well as the features and advantages of the invention will become more apparent from the detailed description of an embodiment thereof which is illustrated by the following accompanying drawings wherein.

Figure 1:
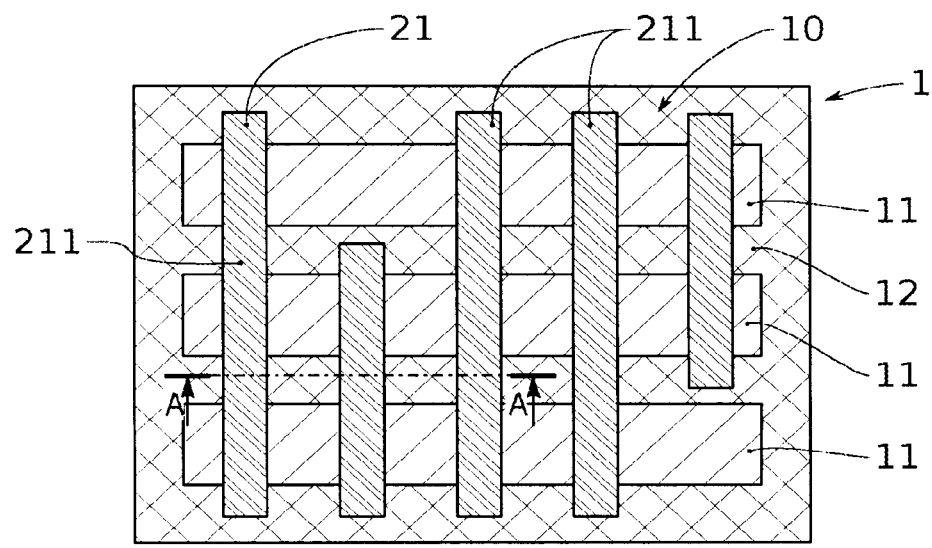
FIG. 1 schematically illustrates a top view of a substrate comprising active areas and adjacent electrical isolation areas, on which are disposed transistor gates.
Figure 2:
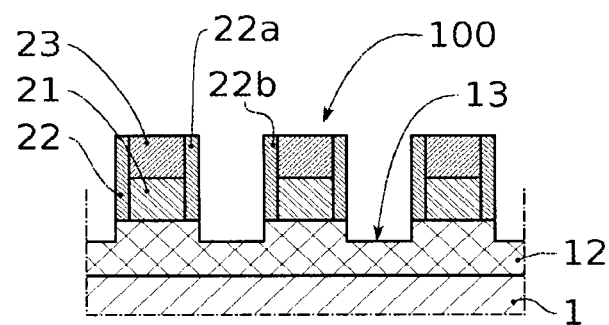
FIG. 2 schematically illustrates a cross-section of a step of forming gate spacers, according to the prior art.
Figure 3:
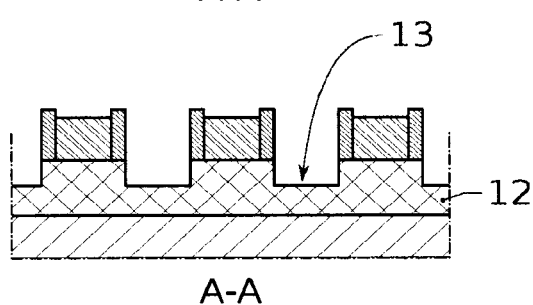
FIG. 3 schematically illustrates a cross-section of a step of removing a hard mask, subsequent to that of FIG. 2, according to the prior art.
Figure 4:
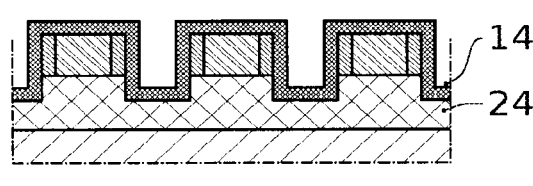
FIG. 4 schematically illustrates a cross-section of a step of depositing a protective layer, subsequent to that of FIG. 3, according to the prior art.
Figure 5:
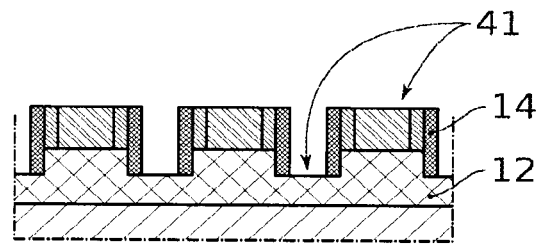
FIG. 5 schematically illustrates a cross-section of an anisotropic etching step, subsequent to that of FIG. 4, according to the prior art.
Figure 6:
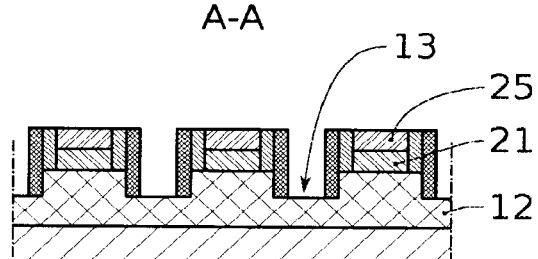
FIG. 6 schematically illustrates a cross-section of a silicidation step, subsequent to that of FIG. 5, according to the prior art.
Figure 7A:
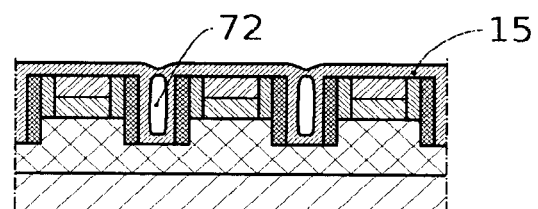
FIG. 7A schematically illustrates a cross-section of a step of forming a mechanically constraining layer, subsequent to that of FIG. 6, according to the prior art.
Figure 7B:
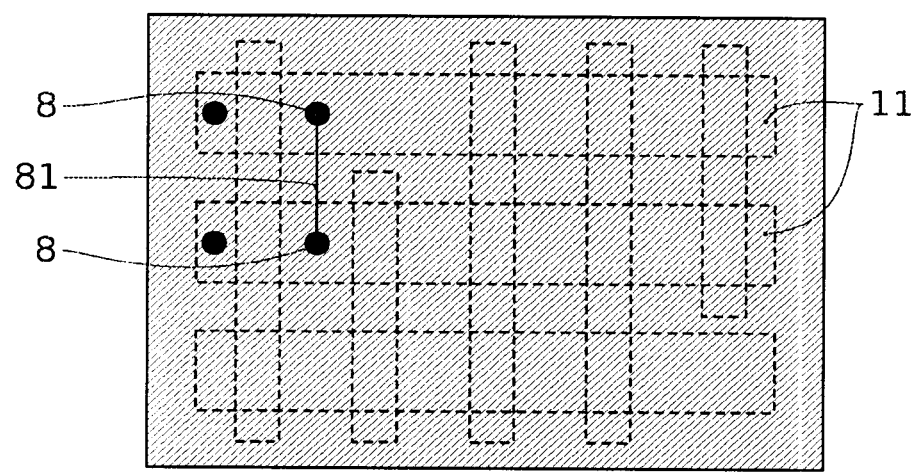
FIG. 7B shows a top view schematically showing a short-circuit between two electrical contacts.

The drawings are given by way of example and are not limiting of the invention. They constitute schematic principle representations intended to facilitate the understanding of the invention and are not necessarily on the scale of practical applications. In particular, the relative thicknesses of the various layers are not representative of reality.

DETAILED DESCRIPTION

Before starting a detailed review of embodiments of the invention, it is recalled that the invention according to its first aspect comprises in particular the optional features below which may be used in combination or alternatively.

According to one possibility, the filling is only partial, in that part of the volume defined by the cavity is not closed by a plug. In another case, the filling is complete; then there no longer remains any residual cavity volume. The filling material plug can then complement the cavity in the isolation area, flush with the level of the exposed surface of said layer. The filling material may also optionally be such that its volume protrudes beyond the surface of the isolation area, thus forming a relief. In this case, the volume of the filling material plug is greater than that of the cavity.

According to one example, the method further comprises forming source and drain areas by doping portions of the at least one active area, said portions being located on either side of the gates.

According to one example, the filling of the at least one cavity is carried out after said formation of source and drain areas.

According to one example, the filling comprises depositing the filling material between the first and second spacers, in and out of the at least one cavity, followed by an etching of the filling material configured to remove a part called sacrificial part of the filling material out of the cavities while retaining a part called useful part of the filling material in the cavities, the useful part forming a plug. This corresponds to the case discussed above wherein, in the end, the filling material only occupies the cavity or only part of the cavity.

According to one example, the etching is a selective etching of said filling material relative to the material of the spacers and the material of the at least one active area.

According to one example, the method further comprises at least one technological step subsequent to the filling and involving consumption of the material, called dielectric material, of the at least one electrical isolation area at exposed portions of the at least one electrical isolation area.

According to one example, the filling material is based on a material configured not to be consumed during the at least one technological step involving a consumption of the dielectric material.

According to one example, the filling material is based on a carbon material.

According to one example, the filling forms a plurality of plugs, each plug filling a cavity within the at least one electrical isolation area and having a height substantially equal to a depth of said cavity so as to close said cavity.

According to one example, the plugs based on the carbon material are removed before a high temperature heat treatment taken from a diffusion anneal and an activation anneal.

According to one example, the filling material is at least partially consumed during the at least one technological step involving consumption of the dielectric material.

According to one example, the filling is repeated several times before the formation of the mechanically constraining layer, so as to alleviate said consumption of the filling material.

According to one example, the filling material is based on a silicon oxide.

According to one example, the filling forms a plurality of plugs, each plug filling a cavity within the at least one electrical isolation area and having a height strictly greater than a depth of said cavity, so that a lower part of the plug is located in the cavity and an upper part of the plug is located outside the cavity.

According to one example, the upper part of the plug has a thickness, called extra thickness, greater than or equal to 5 nm and/or less than or equal to 20 nm.

According to one example, the plugs based on a carbon material are removed before forming the mechanically constraining layer.

According to one example, the plugs based on a carbon material are removed before the silicidation heat treatment of the transistor gates.

In one example, the filling material is based on the material of at least one electrical isolation area.

According to one example, the step of filling the cavities comprises a deposition of the silicon oxide-based filling material by a technique taken from a deposition of the FCVD (Furnace Chemical Vapour Deposition) type, a deposition of the HARP (High Aspect Ratio Process) type or deposition by centrifugation.

According to one example, the selective etching is carried out by the dry process, for example via a remote plasma.

According to one example, the selective etching is carried out by the wet process, for example via a solution based on hydrofluoric acid (HF).

It is specified that in the context of the present invention, the term "on", "surmounts", "covers" or "underlying" or their equivalents do not necessarily mean "in contact with". Thus, for example, the deposition of a first layer on a second layer does not necessarily mean that the two layers are directly in contact with one another, but it means that the first layer at least partially covers the second layer by being either directly in contact therewith or by being separated therefrom by at least one other layer or at least one other element.

Moreover, a layer can be composed of several sub-layers made of the same material or of different materials.

A substrate, a layer, a device, "based" on a material M, means a substrate, a layer, a device comprising this material M only or this material M and possibly other materials, for example alloy elements, impurities or doping elements. Thus, a spacer based on silicon nitride SiN can for example comprise non-stoichiometric silicon nitride (SiN), or stoichiometric silicon nitride (Si3N4), or else a silicon oxynitride (SiON).

Component, device or element of a microelectronic device means any type of element produced with the means of microelectronics. These devices encompass in particular, in addition to purely electronic devices, micromechanical or electromechanical devices (MEMS, NEMS . . . ) as well as optical or optoelectronic devices (MOEMS . . . ).

Several embodiments of the invention implementing successive steps of the manufacturing method are described below. Unless explicitly stated, the adjective "successive" does not necessarily imply, although this is generally preferred, that the steps follow each other immediately, intermediate steps may separate them. Moreover, the term "step" is understood to mean carrying out part of the method, and can denote a set of sub-steps.

The word "dielectric" describes a material whose electrical conductivity is low enough in the given application to serve as an insulator. In the present invention, a dielectric material preferably has a dielectric constant of less than 7. STIs and spacers are typically formed of a dielectric material.

The terms "gate pattern", "gate stack", "gate" are used synonymously.

In the present patent application, a cavity corresponds to a void formed within the electrical isolation area, this void being open at the surface of said electrical isolation area, this void further extending between two spacers of two adjacent respective transistors, in line with said spacers. The hollow formed by the cavity 13 is understood relative to a plane coincident with the isolation area/gate interface.

In the present patent application, a thickness for a layer, a height for a device (transistor or gate for example) and a depth for a cavity or an etching will be considered. The thickness is taken in a direction normal to the main plane of extension of the layer, the height and depth are taken in a direction normal to the base plane of the substrate.

The terms "substantially", "approximately", "of the order of" mean "within 10%" or, in the case of an angular orientation, "within 10°". Thus, a direction substantially normal to a plane means a direction having an angle of 90±10° relative to the plane.

To determine the geometry of the transistors and the disposition of the various layers, electron microscopy analyses can be carried out, in particular by Scanning Electron Microscopy (SEM) or Transmission Electron Microscopy (TEM).

The chemical compositions of the various layers or regions can be determined using the well-known EDX or X-EDS method, acronym for "energy dispersive x-ray spectroscopy" which stands for "energy dispersive analysis of X photons".

This method is well adapted for analysing the composition of portions of small dimensions such as cavities filled with the filling material. It can be implemented on metallurgical sections within an SEM or a TEM.

These techniques allow in particular to determine whether there are residual voids in the isolation trenches and, if applicable, their dimensions, and/or whether there has been repair of cavities in the isolation trenches by filling before forming the stress liner.

The absence of residual voids and/or cavities filled with a filling material are characteristic of the implementation of the method according to the invention. They can therefore be an indication of the implementation of the method according to the invention.

The method for manufacturing transistors will now be described in detail through two embodiments.

Figure 8:
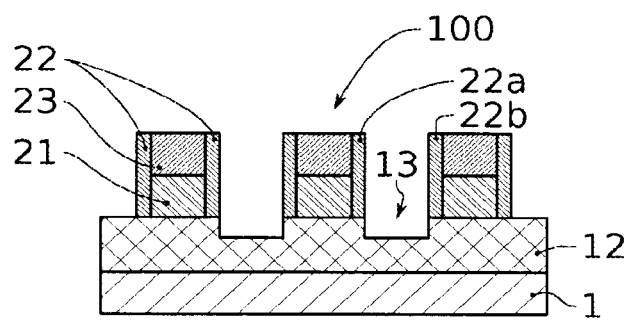
FIG. 8 schematically illustrates a cross-section of a situation of damage to electrical isolation areas after forming the gate spacers of the transistors, according to the prior art.
Figure 14:
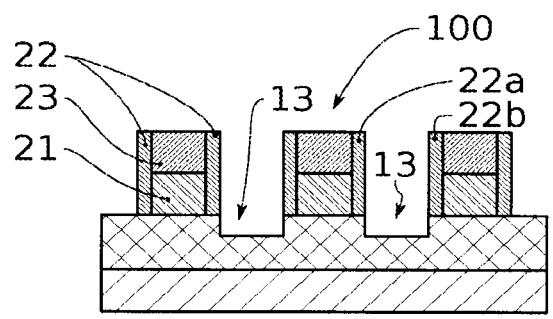
FIG. 14 schematically illustrates a cross-section of a situation of damage to electrical isolation areas after forming the gate spacers of the transistors, according to the prior art.

For these two embodiments, the method comprises a part of conventional steps of manufacturing transistors aiming at forming on a substrate, for each of the transistors, a gate pattern 100 flanked by spacers 22, as illustrated in FIGS. 8 and 14.

The substrate 1 may comprise a part called "bulk" part, active areas 11 made of semiconductor material, and isolation areas 12 made of dielectric material.

The substrate may also be of the semiconductor-on-insulator type, for example a silicon-on-insulator SOI substrate or a germanium-on-insulator GeOI substrate.

In all cases, the transistors are formed on the active areas 11 and electrically isolated by the isolation areas 12, typically STI (shallow trench isolation) type isolation trenches based on silicon oxide.

The gate pattern 100 typically comprises a gate 21 and a hard mask 23 made of silicon nitride (SiN). The gate pattern 100 can have a width called critical dimension comprised between 10 nm and 100 nm and preferably less than or equal to 50 nm.

It can be of the order of a few tens of nanometres in height. The gate 21 typically has a height less than or equal to 100 nm, for example approximately equal to 50 nm. The height of the hard mask 23 is generally comprised between 40 and 80 nanometres.

Two neighbouring gate patterns are separated by a pitch typically less than or equal to 120 nm.

Two neighbouring gate patterns can extend in directions transverse to the main directions of extension of the active areas 11 and STI 12 (FIG. 1). In particular, the same gate pattern can alternately surmount one or more active areas 11 and one or more adjacent STI trenches 12.

Spacers 22 are formed along the sides of this gate pattern 1. The sides of the gate patterns extend in planes substantially normal to the base plane of the substrate.

In a general but non-limiting manner, a spacer forms a ring around the gate, with a closed contour; it can therefore be a single spacer around the gate; however, the cross-sectional representations, and the preferred directions of the gates, mean that it is also pairs of spacers (or first and second spacers), terminology used here.

In a known manner, the formation of these spacers 22 can comprise a conformal deposition of a layer in particular of SiN on and between the gate patterns 1, followed by an anisotropic etching of the SiN.

The deposition can typically be done by CVD, acronym for "chemical vapour deposition", or ALD, acronym for "Atomic Layer deposition", so as to form a layer of SiN having a thickness less than or equal to 15 nm, for example comprised between 6 nm and 15 nm, preferably between 8 nm and 12 nm.

Alternatively to SiN, a dielectric material of the Low-k type (of dielectric constant k<7) can be used to form the spacers 22. For example and without limitation, this material can be SiBCN or SiCO. The "SiN layer" to which reference is made for the sake of clarity can therefore be understood as "the layer of a low-k type dielectric material used to form the spacers 22". Also, the spacers can be made of oxide or of an Oxide-nitride bilayer. Low-k materials have the advantage of limiting stray capacitance problems.

The anisotropic etching is configured to consume the SiN layer portions located at the top of the gate patterns and between the gate patterns, on the substrate. It can be carried out by plasma, for example based on a fluorocarbon type chemistry, in an Inductively Coupled Plasma ICP reactor.

The shape factor of the gate patterns 100 generally induces a faster consumption of the layer portions at the base of the gate patterns, on the substrate, compared to the layer portions at the top of the gate patterns.

This induces a phenomenon of over-etching at the exposed areas of the substrate, in particular at the exposed areas of the STI 12.

Consequently, cavities 13 form on the surface of the exposed STI trenches 12. The cavities 13 are bordered laterally by a first spacer 22a of a first transistor and by a second spacer 22b of a second transistor as referenced in FIG. 8 (and in FIG. 14).

During the following conventional manufacturing steps (in particular doping by implantation of the active areas for the manufacture of the source and drain, and possible epitaxies at the active areas, for example for the manufacture of a Raised Source and Drain called RSD), these cavities 13 can develop and their depth can increase.

The method according to the invention aims at limiting or eliminating the disadvantages associated with the presence of these cavities 13.

According to a first embodiment illustrated in FIGS. 8 to 13, the method comprises, after forming the first spacers 22 and after a first doping by implantation, a step of filling the cavities by depositing a carbon material.

Figure 9:
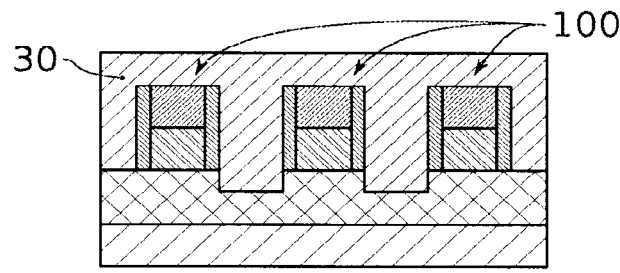
FIG. 9 schematically illustrates a cross-section of a step of depositing a filling material from the situation illustrated in FIG. 8, according to a first embodiment of the invention.

As illustrated in FIG. 9, a deposition of a carbon layer 30 can be carried out for example by centrifugation, so as to fill the spaces between the gate patterns 100. This carbon layer 30 can optionally cover the top of the gate patterns 100. This layer 30 can thus be used to encapsulate all the underlying elements.

This carbon layer 30, for example amorphous carbon, can be, without limitation, formed from a carbon resin whose viscosity properties are adapted to a spreading by centrifugation. Annealing after spreading can allow to evaporate the solvents and/or to crosslink the resin so as to obtain the solid carbon layer 30.

Various carbon resins can be used, such as: polymethyl methacrylate (PMMA) or polydimethylsiloxane (PDMS).

The thickness of the carbon layer 30 obtained depends in particular on the shape factor of the gate patterns, on the viscosity of the resin, on the spreading (centrifugation speed, spreading time) and on the anneal (temperature, anneal time) parameters.

Figure 10:
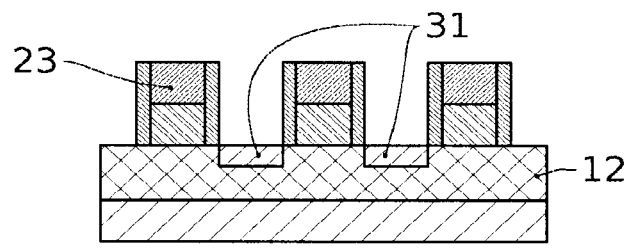
FIG. 10 schematically illustrates a cross-section of a step of etching the filling material, subsequent to that of FIG. 9, according to a first embodiment of the invention.

As illustrated in FIG. 10, a partial etching of the carbon layer 30 is carried out so as to retain only one carbon material plug 31 in each cavity 13 of the STI 12.

The etching is preferably carried out by plasma in an Inductively Coupled Plasma ICP or Capacitively Coupled plasma CCP reactor. This plasma can be oxygen-based.

The partial etching is preferably configured to obtain a plug 31 having substantially the same thickness as the depth of the cavity 13 that it fills. The surface between the spacers 22a, 22b of the adjacent transistors can thus be as flat as possible.

Such a carbon material plug 31 is advantageously not consumed during the following steps of manufacturing the transistors, in particular because of the chemistries used during the steps of removing the hard mask 23 and of pre-silicidation cleaning, in particular based on HF and direct or remote plasma attacking the native oxide present on the sources and drain and the gate.

Figure 11:
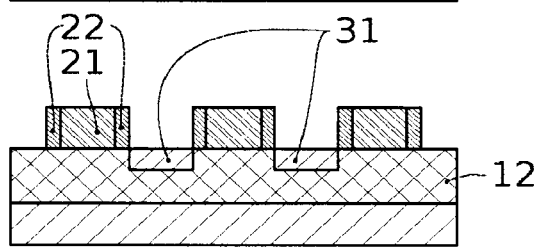
FIG. 11 schematically illustrates a cross-section of a step of removing a hard mask, subsequent to that of FIG. 10, according to a first embodiment of the invention.

As illustrated in FIG. 11, the hard mask 23 is indeed removed by anisotropic etching of the SiN. This removal can also induce a partial removal of the material from the spacers 22, removal not visible in FIG. 11. This removal can be carried out with a solution of phosphoric acid ($H_3PO_4$), which is preferably hot, in particular above 43° C.

The selectivity of this etching relative to the silicon oxide of the STI 12 is not high enough to avoid consumption of the silicon oxide. Thus, in the absence of plug 31, the cavity 13 would be enlarged.

The selectivity of this etching relative to the carbon material of the plug 31 is high enough to avoid consumption of the carbon material. Thus, the plug 31 is preserved and allows effective protection against the enlargement of the cavity 13.

Figure 12:
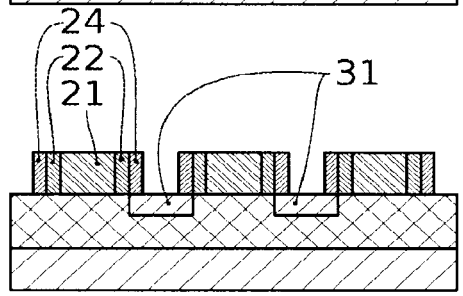
FIG. 12 schematically illustrates a cross-section of a step of anisotropic etching of a protective layer, subsequent to that of FIG. 11, according to a first embodiment of the invention.

As illustrated in FIG. 12, a protective layer preferably made of SiN is deposited then anisotropically etched. Lateral portions 24 of the protective layer are thus kept on the sides of the first spacers 22. These lateral portions 24 define second spacers allowing to increase the width of material covering the sides of the gates 21 and, consequently, to reduce the interstitial space between two adjacent gate patterns. These second spacers allow to laterally delimit a second ion implantation.

This anisotropic etching of the protective layer can be a dry etching carried out by plasma.

The plug 31 therefore provides effective protection against the enlargement of the cavity 13 also during this step (FIG. 12).

The following steps may comprise high temperature anneals.

In particular, a diffusion and/or activation anneal of the dopants implanted during the second ion implantation, often called "spike anneal", can be performed.

Figure 13:
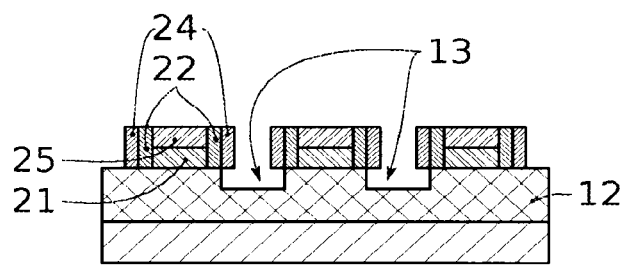
FIG. 13 schematically illustrates a cross-section of a step of removing the filling material, subsequent to that of FIG. 12, according to a first embodiment of the invention.

As illustrated in FIG. 13, a step of siliciding a portion 25 of the gate 21 can also be performed.

This step comprises the deposition of a metal, for example nickel or a nickel (Ni) based alloy, on the top of the gates 21, and several thermal anneals aiming in particular at diffusing the metal in the gate (diffusion anneal) to form a silicide (NiSi or NiPtSi) and at passivating or avoiding electrically active defects (silicidation anneal of the DSA, acronym for "Dynamic Surface Anneal", type).

The plug 31 is preferably removed before the thermal anneals, in particular rapid high temperature thermal anneals such as "spike anneal" and DSA activation anneals.

This removal can be done by oxygen-based plasma. The etching of the plugs 31 is preferably the same as the initial etching allowing to form the plugs 31.

According to one possibility, the plug 31 can be made later in the sequence of manufacturing steps of the transistors, for example after removal of the hard mask 23.

This carbon material plug 31 allows to limit or even eliminate the consumption of silicon oxide at the cavities 13 of the STI 12. The cavities 13 are thus shallower. The shape factor of the gate patterns is improved.

The deposition of the stress liner can then be performed (not illustrated) while limiting the appearance of residual voids.

Typically, the stress liner is a layer of nitride, in particular a layer of silicon nitride (SiN or $Si_xN_y$ x and y being integers).

It can be deposited in a compliant manner by one of the following techniques: plasma enhanced chemical vapour deposition (PECVD), low pressure chemical vapour deposition (LPCVD), rapid thermal CVD deposition (RTCVD), atomic layer deposition (ALD). Other types of depositions can be considered.

The stress liner can have a thickness of a few nanometres to a few tens of nanometres, and in particular a thickness comprised between 5 and 40 nanometres, for example 20 nm.

It is not excluded to deposit a plurality of stress liners or to limit the deposition of the stress liner to one area of the face of the substrate, and, optionally, to coat at least one other area of the face of the substrate with at least another stress liner, for example to implement mechanical stresses of opposite signs (in compression and in tension).

According to a second embodiment illustrated in FIGS. 14 to 17, the method comprises, after forming the spacers and doping by implantation (FIG. 14), a step of filling the cavities by depositing a silicon oxide. More generally, it can be an identical material to the underlying one (the one wherein the STI is formed). This is a material capable of being consumed during at least one of the treatment steps indicated, in particular the etchings, this consumption being advantageously equivalent to that of the STI material.

Figure 15:
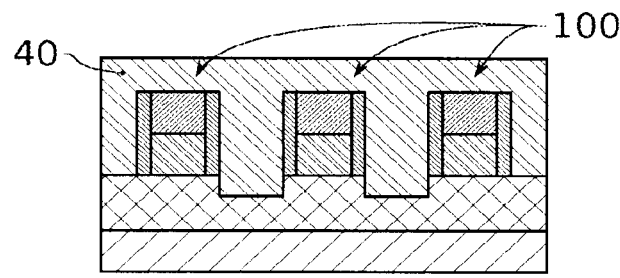
FIG. 15 schematically illustrates a cross-section of a step of depositing a filling material from the situation illustrated in FIG. 14, according to a second embodiment of the invention.

As illustrated in FIG. 15, a deposition of a silicon oxide layer 40 is carried out so as to fill the spaces between gate patterns 1. Optionally, the layer 40 may cover the gate patterns so that it forms an encapsulation of all the underlying elements.

This deposition can be done by one of the following techniques: chemical vapour deposition FCVD (acronym for Furnace Chemical Vapour Deposition), oxide deposition under HARP (acronym for High Aspect Ratio Process) type conditions, Flowable oxide CVD or deposition by centrifugation.

The oxide deposition called HARP uses optimised deposition conditions to fill the spaces between narrow and deep patterns 1.

This deposition is typically done from a TEOS precursor in an ozone (O3) atmosphere. The HARP deposition conditions are preferably as follows:

The deposition by centrifugation can be carried out using silicate resins of the "spin on glass" type. After spreading the silicate resin by centrifugation, an anneal typically allows to form the silicon oxide layer 40.

The silicon oxide layer 40 thus formed can optionally cover the top of the gate patterns 1. The thickness of the layer 40 can for example be greater than 15 nm.

Figure 16:
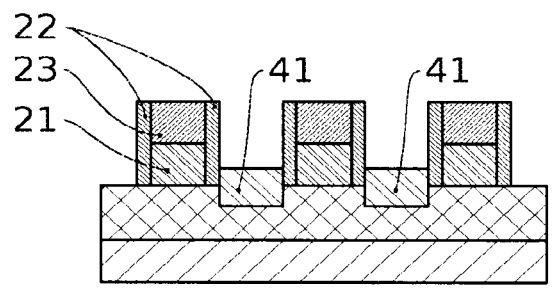
FIG. 16 schematically illustrates a cross-section of a step of etching the filling material, subsequent to that of FIG. 15, according to a second embodiment of the invention.

As illustrated in FIG. 16, a partial etching of the silicon oxide layer 40 is performed so as to retain only one silicon oxide plug 41 in each cavity 13 of the STI 12.

The etching can be carried out by dry process via a remote plasma or wet process via a solution based on hydrofluoric acid (HF). Such etching is advantageously selective relative to the surrounding materials and in particular relative to the material of the spacers 22 (SiN, SiCO, SiCBN for example) and the semiconductor material of the active areas (Si, Ge, SiGe for example).

The partial etching is preferably configured to obtain a plug 41 having a thickness strictly greater than the depth of the cavity 13 which it fills. This plug 41 therefore has an extra thickness corresponding to a part outside the cavity 13, between the patterns 1.

The extra thickness of this silicon oxide plug 41 is preferably selected so as to compensate for the consumption of silicon oxide during the subsequent etching and cleaning steps, in particular during the steps of removing the hard mask 23 and pre-silicidation cleaning.

This extra thickness may in particular be greater than or equal to 10 nm, for example of the order of 15 nm.

Part of the extra thickness of the silicon oxide plug 41 is therefore consumed during the removal of the hard mask 23 by anisotropic etching of the SiN. The consumption related to this removal step is typically of the order of 5 nm.

Part of the extra thickness of the silicon oxide plug 41 is also consumed during the anisotropic etching of the SiN protective layer (not shown). The consumption related to this etching step is typically of the order of 5 nm.

Figure 17:
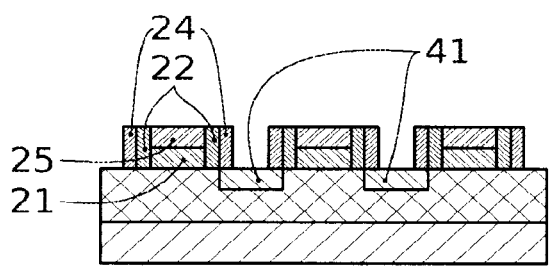
FIG. 17 schematically illustrates a cross-section of a step of anisotropic etching of a protective layer, subsequent to that of FIG. 16, according to a second embodiment of the invention.

As illustrated in FIG. 17, part of the extra thickness of the silicon oxide plug 41 is also consumed during the step of siliciding the portions 25 of the gates 21. The consumption related to this silicidation step is typically of the order of 5 nm.

The silicon oxide plugs 41 therefore allow to preserve and close the STI 12 by closing the cavities 13.

Advantageously, the plugs 41 can be kept during thermal anneals, in particular during rapid thermal anneals at high temperature.

According to one possibility, the step of filling the cavities with silicon oxide can be repeated at least once after one of the etching and/or cleaning steps. It may optionally be repeated after each etching and/or cleaning step.

The plug 41 is thus regenerated and the STIs 12 are protected and repaired throughout the steps of manufacturing the transistors, before depositing the stress liner.

The deposition of the stress liner can then be performed (not illustrated) by limiting or even avoiding the appearance of residual voids.

An interest of the invention is to increase the manufacturing reliability of transistors.

The subsequent steps of forming the electrical contacts on the electrically active areas of the transistors (source/drain and gate areas) can in particular be carried out without risk of a short-circuit between two active areas 11 linked to an untimely filling of a residual void at the TSIs 12.

The invention claimed is:

1. A method for producing a component based on a plurality of transistors on a substrate comprising an active area and an electrical isolation area, each transistor of the plurality of transistors comprising a gate and spacers on either side of the gate, the electrical isolation area comprising at least one cavity formed as a hollow between a spacer of a first transistor of the plurality of transistors and a spacer of a second transistor of the plurality of transistors, the first transistor and the second transistor being adjacent, the method comprising:
    forming the gates of the transistors;
    forming the spacers;
    forming a mechanically constraining layer for the transistors;
    after forming the spacers and before forming the mechanically constraining layer, forming a filling configured to at least partially fill, with a filling material, the at least one cavity within the electrical isolation area, between the spacer of the first transistor and the spacer of the second transistor; and
    at least one step, subsequent to the filling, of consumption of a dielectric material of the at least one electrical isolation area at exposed portions of the at least one electrical isolation area,
    wherein the filling material is based on a carbon material configured not to be consumed during the at least one step of the consumption of the dielectric material, and wherein the filling material is removed before a high temperature heat treatment chosen from a diffusion anneal and an activation anneal.

2. The method according to claim 1, further comprising forming source and drain areas by doping portions of the active area, the portions being located on either side of the gates, wherein the filling of the at least one cavity is carried out after the forming of the source and drain areas.

3. The method according to claim 1, wherein the filling is configured to completely fill the at least one cavity with the filling material.

4. The method according to claim 1, wherein the forming of the filling comprises depositing the filling material between the spacer of the first transistor and the spacer of the second transistor, in and out of the at least one cavity, followed by an etching of the filling material configured to remove a sacrificial part of the filling material out of the at least one cavity while retaining a useful part of the filling material in the at least one cavity, the useful part forming a plug.

5. The method according to claim 4, wherein the etching is a selective etching of the filling material relative to a material of the spacers and to a material of the at least one active area.

6. The method according to claim 1, wherein the filling forms a plurality of plugs, each plug of the plurality of plugs filling a cavity within the electrical isolation area and having a height equal to a depth of the cavity so as to close the cavity.

* * * * *